(12) United States Patent
Krames et al.

(10) Patent No.: US 11,233,181 B2
(45) Date of Patent: Jan. 25, 2022

(54) CONVERTER SYSTEM

(71) Applicant: SEABOROUGH IP I B.V., Amsterdam (NL)

(72) Inventors: Michael Krames, Mountain View, CA (US); Marie Anne Van De Haar, Weesp (NL)

(73) Assignee: SEABOROUGH IP I B.V., Amsterdam (NL)

( * ) Notice: Subject to any disclaimer, the term of this patent is extended or adjusted under 35 U.S.C. 154(b) by 407 days.

(21) Appl. No.: 16/338,728

(22) PCT Filed: Oct. 20, 2017

(86) PCT No.: PCT/EP2017/076912
§ 371 (c)(1),
(2) Date: Apr. 2, 2019

(87) PCT Pub. No.: WO2018/073441
PCT Pub. Date: Apr. 26, 2018

(65) Prior Publication Data
US 2021/0288228 A1    Sep. 16, 2021

(30) Foreign Application Priority Data

Oct. 21, 2016   (DE) .......................... 102016120101.4

(51) Int. Cl.
*C09K 11/77* (2006.01)
*H01L 33/50* (2010.01)

(52) U.S. Cl.
CPC ........ *H01L 33/504* (2013.01); *C09K 11/7774* (2013.01); *C09K 11/7794* (2013.01)

(58) Field of Classification Search
CPC .............. H01L 33/504; C09K 11/7774; C09K 11/7728; C09K 11/7715
(Continued)

(56) References Cited

U.S. PATENT DOCUMENTS

2005/0023955 A1\* 2/2005 Otsuka .................... H01J 61/44
                                                                                  313/486
2005/0136782 A1   6/2005 Chen
(Continued)

FOREIGN PATENT DOCUMENTS

EP         1046196 B1    1/2008
EP         2843299 A1    3/2015
(Continued)

OTHER PUBLICATIONS

Mengmeng Shang et al.: "Synthesis and Luminescent Properties of Li3Ba2Y3(MoO4)8:Ln3+ (Ln=Eu, Tb, Dy) Phosphors for UV-LEDs", Journal of The Electrochemical Society, Jan. 1, 2011 (Jan. 1, 2011), p. H565, XP055225268, DOI: 10.1149/1.3560528 Retrieved from the Internet: URL:http://jes.ecsdl.org/content/158/5/H565.full.pdf [retrieved on Nov. 3, 2015].
(Continued)

*Primary Examiner* — Christopher M Raabe
(74) *Attorney, Agent, or Firm* — David P. Owen; Hoyng Rokh Monegier B.V.

(57) ABSTRACT

The present invention relates to a light emitting device comprising a red-emitting $Eu^{3+}$ material and green emitting $Ce^{3+}$ material which are matched so that the resulting white light has an increased lumen equivalent of radiation for a given color rendering index than with the prior art.

15 Claims, 8 Drawing Sheets

Wavelength (nm)

(58) Field of Classification Search
USPC .......................................................... 257/98
See application file for complete search history.

(56) References Cited

U.S. PATENT DOCUMENTS

| 2007/0114495 | A1  | 5/2007 | Huang |
| 2007/0182309 | A1* | 8/2007 | Wang ............... H05B 33/14 |
| | | | 313/486 |
| 2008/0123324 | A1* | 5/2008 | Daicho ............ C09K 11/7734 |
| | | | 362/84 |

FOREIGN PATENT DOCUMENTS

| JP | 09271891 A | * | 10/1997 |
| WO | 2006087661 A1 | | 8/2006 |
| WO | 2013158993 A1 | | 10/2013 |
| WO | 2015052238 A1 | | 4/2015 |
| WO | 2016207380 A1 | | 12/2016 |

OTHER PUBLICATIONS

Arturas Katelnikovas, et al, "Synthesis and optical properties of L13Ba2La3(MoO4)8:Eu3+ powders and ceramics for pcLEDs", Journal of Materials Chemistry, Sep. 6, 2012, 22, 22126-22134.

* cited by examiner

CONVERTER SYSTEM

The present invention relates to the field of converter systems for light emitting devices and suitable materials therefor, more specifically light emitting diode (LEDs) and laser diodes (LDs).

These devices usually are based on a blue-, violet- and/or ultraviolet (UV)-emitting semiconductor materials, most often based on the (Al,In,Ga)N material system, in which the blue, violet or UV primary radiation is converted by suitable down-conversion materials (e.g., phosphors) into blue, green, yellow and/or red emission (depending on the application).

Of particular interest are luminescence conversion materials or systems, which are able to absorb light in the UV-A, blue, violet or green spectral range (approximately 380-600 nm) and to emit red, orange or yellow. For this purpose, mostly phosphors including $Eu^{2+}$ are used because $Eu^{2+}$—in an appropriate environment—has corresponding favorable properties. However, a disadvantage of the use of $Eu^{2+}$ is the often low spectral luminous efficacy of radiation (LER) due to the large full width at half maximum (fwhm) of emission, which often greatly reduces the efficacy of the devices with respect to visible spectrum applications. Alternatively, in the literature the use of activators such as, e.g., $Mn^{4+}$ is proposed. However, $Mn^{4+}$ is a strong oxidizing agent in fluorides or oxides, for example $MnO_2$ (manganese dioxide) or $MnF_4$, which has resulted in significant disadvantages in many applications. In addition, host lattices incorporating $Mn^{4+}$ are known to photo-saturate at excitation levels achievable in LEDs.

It is thus an object to provide a light emitting device and/or a suitable material system which is able to overcome these disadvantages at least partly. This object is achieved by a converter system according to claim 1. Accordingly, a converter system for a light emitting device is proposed, comprising:
- a first material doped with $Ce^{3+}$ and
- a second material doped with $Eu^{3+}$ and emitting in the red spectral range so that the converter system shows an emission spectrum with a peak between $\geq 605$ to $\leq 630$ nm.

In the sense of the present invention the term "peak" at a certain wavelength especially means and/or includes an increase in emission intensity of at least 100% compared to the minimum emission intensity in an area $\pm 8$ nm of that certain wavelength.

Preferably the first material is capable of emitting in the green and/or yellow spectral range.

Preferably the converter system shows an emission spectrum with a peak between $\geq 610$ to $\leq 630$ nm, preferably about $\geq 615$ to $\leq 625$ nm.

According to a preferred embodiment of the present invention, the converter system shows an emission spectrum with a dip between $\geq 520$ to $\leq 545$ nm.

In the sense of the present invention the term "dip" at a certain wavelength especially means and/or includes a decrease in emission intensity of at least 50% compared to the maximum emission intensity in an area $\pm 8$ nm of that certain wavelength.

Preferably the converter system shows an emission spectrum with a dip between $\geq 530$ to $\leq 540$ nm, preferably about 535 nm.

Alternatively or additionally, the object of the invention is achieved by, a converter system for a light emitting device, comprising

- a first material doped with $Ce^{3+}$ and capable of emitting in the green and/or yellow spectral range; and
- a second material doped with $Eu^{3+}$ and emitting in the red spectral range so that molar ratio between $Eu^{3+}:Ce^{3+}$ is from $\geq 400:1$ to $\leq 20000:1$, preferably $\geq 800:1$ to $\leq 5000:1$, yet preferably $\geq 1000:1$ to $\leq 3500:1$, most preferred $\geq 1500$ to $\leq 2500:1$.

Such a ratio can in many applications either be set by using a low amount of a higher doped $Ce^{3+}$ compound or using a lower doped $Ce^{3+}$ compound in a larger amounts. Suitable combinations of $Eu^{3+}$ and $Ce^{3+}$ doped compounds are e.g. given in the table below. (In all embodiments, $Eu^{3+}$ doping concentrations are 80% on the lanthanide site in the formula $Li_3Ba_2Tb_3(MoO_4)_8:Eu^{3+}$.):

| Garnet $Ce^{3+}$ doping concentration | Weight ratio $Lu_3Al_5O_{12}:Ce^{3+}/$ $Li_3Ba_2(Tb_{0.2},$ $EU_{0.8})_3(MoO_4)_8$ | Molar ratio $Ce^{3+}:Eu^{3+}$ (approx.) | Weight ratio $Y_3Al_5O_{12}:Ce^{3+}/$ $Li_3Ba_2(Tb_{0.2},$ $EU_{0.8})_3(MoO_4)_8$ | Molar ratio $Ce^{3+}:Eu^{3+}$ (approx.) |
|---|---|---|---|---|
| 0.01% | 1:0.54 | 1:1800 | 1:0.43 | 1:2400 |
| 0.1% | 1:5.4 | 1:1800 | 1:4.3 | 1:2400 |
| 1% | 1:54 | 1:1800: | 1:43 | 1:2400 |

It should be noted that the above combination leads to a converter system that in combination with a suitable blue emitter leads to white emission with a correlated color temperature (in K) of about 3000. However, many other color temperatures are possible under the teaching of this invention by suitable tuning of the doping and/or weight ratios.

For example, the color temperature of the LED can be varied by choosing different $Eu^{3+}:Ce^{3+}$ ratios, as from the table below:

| Color temperature (K) | Preferred $Ce^{3+}/Eu^{3+}$ molar ratio using $Lu_3Al_5O_{12}:Ce^{3+}$ as garnet (approximately) | Preferred $Ce^{3+}/Eu^{3+}$ molar ratio using $Y_3Al_5O_{12}:Ce^{3+}$ as garnet (approximately) |
|---|---|---|
| 10000 | 1:480 | 1:470 |
| 6000 | 1:590 | 1:650 |
| 4000 | 1:1100 | 1:770 |
| 3000 | 1:1800 | 1:2400 |
| 1500 | 1:16500 | Not measured |

Therefore it is one preferred embodiment of the present invention that the ratio of $Eu^{3+}:Ce^{3+}$ is from $\geq 1100:1$ to $\leq 4000:1$, preferably $\geq 1700:1$ to $\leq 2500:1$, especially when a color temperature of about 3000K is envisaged.

Additionally it is one preferred embodiment of the present invention that the ratio of $Eu^{3+}:Ce^{3+}$ is from $\geq 600:1$ to $\leq 2000:1$, preferably $\geq 900:1$ to $\leq 1900:1$, especially when a color temperature of about 4000K is envisaged.

Yet alternatively it is one preferred embodiment of the present invention that the ratio of $Eu^{3+}:Ce^{3+}$ is from $\geq 400:1$ to $\leq 1000:1$, preferably $\geq 400:1$ to $\leq 800:1$ especially when a color temperature of about 6000K or higher is envisaged.

According to a preferred embodiment of the present invention, especially for a $Ce^{3+}$ doping percentage of 0.1%, the weight ratio of the red emitting material to the green and/or yellow emitting material is $\geq 2:1$ to $\leq 10:1$ preferably is $\geq 4:1$ to $\leq 6:1$. This has been shown for many applications to be a good compromise between reaching the desired molar ratio and keeping both the doping level ratio and the absolute weight ratio between the first and the second material in a suitable range.

According to the present invention, the term "red emitting" and or "red spectral range" refers to and/or encompasses a material which upon suitable excitation has an emission band between 600 nm and 650 nm.

According to the present invention, the term "green and/or yellow emitting" or "green and/or yellow spectral range" refers to and/or encompasses a material which upon suitable excitation has an emission band between 500 nm and 600 nm.

Surprisingly, it has so been found that the properties of the light emitting device can be greatly improved in many applications and thus $Eu^{3+}$ ions may be reasonably used in light emitting devices, since due to the inventive relationship a proper emission ratio is ensured.

In particular, the device according to the present invention in most embodiments and specific forms provides one or more of the following advantages:

The inventive converter system allows to obtain a light emitting device with a much better LER for a given colour rendering index (CRI) than with the prior art, especially for CRIs above 80

The inventive converter system enjoys a smaller overall Stokes' shift compared to systems based on $Eu^{2+}$ materials According to a preferred embodiment of the present invention, the ratio of the $Eu^{3+}$ peak to the maximum peak in the green and/or yellow emitting wavelength range is ≥2.

The term "$Eu^{3+}$ peak" in the sense of this invention means the maximum peak of the emission in the red emitting wavelength range caused by the $Eu^{3+}$ in the second material.

The term "maximum peak in the green and/or yellow emitting wavelength range" means the maximum peak in the wavelength range from 500 to 600 nm.

It has been shown that by setting the ratio as described, white emission spectra may be achieved with higher LER compared to emission spectra relying on Eu2+ red emission, especially for cases of high color rendering (CRI>80).

According to preferred embodiments of the present invention, the preferred ratios of the $Eu^{3+}$ peak to the maximum peak in the green range ("peak ratio") for white emission spectra as a function of correlated color temperature (CCT) are as listed in the table below, whereby all of these ratios are independently from each other to be regarded as preferred embodiments with in the present invention:

| Correlated Color Temperature (K) | Preferred Peak Ratio |
|---|---|
| 1800 | ≥25-≤29x |
| 2200 | ≥15-≤19x |
| 2700 | ≥10-≤12x |
| 3000 | ≥8-≤10x |
| 4000 | ≥4-≤6x |
| 5000 | ≥2-≤4x |

According to a preferred embodiment of the present invention, the first material doped with $Ce^{3+}$ (further to be called "first material" for the sake of brevity) comprises a garnet and/or cubic material, preferably consisting essentially of a garnet and/or cubic material.

In the sense of the present the term "consisting essentially" means ≥95 wt %, more preferably ≥98 wt %, most preferred ≥99 wt %.

According to a preferred embodiment of the invention, the first material comprises a material selected from the group consisting of $(Y_{1-x}Gd_x)_3(Al_{1-y}Ga_y)_5O_{12}$:Ce, $(Y_{1-x}Tb_x)_3(Al_{1-y}Ga_y)_5O_{12}$:Ce, $(Y_{1-x}Dy_x)_3(Al_{1-y}Ga_y)_5O_{12}$, $(Lu_{1-x}Y_x)_3(Al_{1-y}Ga_y)_5O_{12}$:Ce, $Lu_3(Al_{1-x}Sc_x)_5O_{12}$:Ce or mixtures or chemical combinations thereof. Preferably it consists substantially thereof.

Herein, particularly preferred are $(Lu_{1-x}Y_x)_3(Al_{1-y}Ga_y)_5O_{12}$:Ce and/or $Lu_3(Al_{1-x}Sc_x)_5O_{12}$:Ce.

According to a preferred embodiment of the present invention, the second material doped with $Eu^{3+}$ and emitting in the red spectral range (further to be called "second material") comprises a material selected from the group consisting of phosphates, sulfates, oxides, borates, molybdates, tungstates, vanadates, niobates, tantalates or mixtures or chemical combinations thereof. Preferably it consists essentially thereof.

According to a preferred embodiment of the present invention, the second material comprises a material selected from the group consisting of $(Ba_{1-x}Sr_x)_{2+n}SiO_{4+n}$:Eu, $(Sr_{1-x}Ca_x)_{2+n}SiO_{4+n}$:Eu,
$(Sr_{1-x}Ca_x)Ga_2S_4$:Eu with x≥0% to ≤1 and n=0 or 1
$(Sr_{1-x}Ca_x)Ga_2S_4$:Eu with x≥0% to ≤1
$ALn_{1-x-y}Eu_xM_2O_8$:$RE_y$,
$(Ln_{1-x-y}Eu_x)_2MO_6$:$RE_{2y}$,
$(Ln_{1-x-y}Eu_x)_2M_2O_9$:$RE_{2y}$,
$(Ln_{1-x-y}Eu_x)_2M_3O_{12}$:$RE_{2y}$,
$(Ln_{1-x-y}Eu_x)_2M_4O_{15}$:$RE_{2y}$,
$(Ln_{1-x-y}Eu_x)_6MO_{12}$:$RE_{6y}$,
$(AE_{1-2x-y}Eu_xA_{x+y})_3MO_6$:$RE_{3y}$,
$A_3AE_2(Ln_{1-x-y}Eu_x)_3(MO_4)_8$:$RE_y$,
or mixtures or chemical combinations thereof
wherein—for each structure independently—A is an alkaline metal, i.e. selected from the group consisting of lithium, sodium, potassium, rubidium, cesium or mixtures or chemical combinations thereof, AE is an alkaline earth metal, i.e. selected from the group consisting of beryllium, magnesium, calcium, strontium, barium or mixtures or chemical combinations thereof, Ln is a rare earth metal selected from the group consisting of scandium, yttrium, lanthanum, gadolinium and lutetium or mixtures or chemical combinations thereof, M is molybdenum, tungsten or mixtures or chemical combinations thereof, RE is a rare earth metal selected from the group consisting of terbium, dysprosium, praseodymium, neodymium or mixtures or chemical combinations thereof, wherein 0<x≤1 and 0≤y is ≤0.05.

Herein, RE is a co-doping, that is, preferably y≥0.001 and ≤0.05, more preferably y≥0.01 and ≤0.03. Alternatively, however, also structures are preferred which do not contain RE, these are also preferred embodiments of the invention, i.e. y=0.

Preferably it essentially consists of the aforementioned materials.

According to a preferred embodiment of the invention the second material comprises a material selected from the group consisting of $Li_3Ba_2(Tb_{1-x-y}Eu_xLn_y)_3(Mo_{1-z}W_z)_8O_{32}$,
$A_3AE_2(Tb_{1-x-y}Eu_xLn_y)_3(Mo_{1-z}W_z)_8O_{32}$,
$A(Tb_{1-x-y}Eu_xLn_y)(Mo_{1-z}W_z)_2O_8$,
$(Tb_{1-x-y}Eu_xLn_y)_2(Mo_{1-z}W_z)O_6$,
$(Tb_{1-x-y}Eu_xLn_y)_2(Mo_{1-z}W_z)_2O_9$,
$(Tb_{1-x-y}Eu_xLn_y)_2(Mo_{1-z}W_z)_4O_{15}$,
$(Tb_{1-x-y}Eu_xLn_y)_2SiO_5$,
$(Tb_{1-x-y}Eu_xLn_y)_2Si_2O_7$,
$A(Tb_{1-x-y}Eu_xLn_y)SiO_4$,
$Ba_2(Tb_{1-x-y}Eu_xLn_y)_2Si_4O_{13}$,
$AE_2(Tb_{1-x-y}Eu_xLn_y)_2Si_4O_{13}$,
$Sr_3(Tb_{1-x-y}Eu_xLn_y)_2Si_6O_{18}$,
$AE_3(Tb_{1-x-y}Eu_xLn_y)_2Si_6O_{18}$,
$(Tb_{1-x-y}Eu_xLn_y)_2GeO_5$,
$(Tb_{1-x-y}Eu_xLn_y)_2Ge_2O_7$, $A(Tb_{1-x-y}Eu_xLn_y)GeO_4$,
$Ba_2(Tb_{1-x-y}Eu_xLn_y)_2Ge_4O_{13}$,
$AE_2(Tb_{1-x-y}Eu_xLn_y)_2Ge_4O_{13}$,
$Sr_3(Tb_{1-x-y}Eu_xLn_y)_2Ge_6O_{18}$
$AE_3(Tb_{1-x-y}Eu_xLn_y)_2Ge_6O_{18}$
$(Tb_{1-x-y}Eu_xLn_y)_2(Ge_{1-a-b}Zr_aHf_b)O_5$,
$(Tb_{1-x-y}Eu_xLn_y)_2(Ge_{1-a-b}Zr_aHf_b)_2O_7$,
$A(Tb_{1-x-y}Eu_xLn_y)(Ge_{1-a-b}Zr_aHf_b)O_4$,
$Ba_2(Tb_{1-x-y}Eu_xLn_y)_2(Ge_{1-a-b}Zr_aHf_b)_4O_{13}$,
$Sr_3(Tb_{1-x-y}Eu_xLn_y)_2(Ge_{1-a-b}Zr_aHf_b)_6O_{18}$
with (for each material independently)
Ln=La, Gd, Lu, Y or mixtures or chemical combinations thereof,
A=Li, Na, K, Rb, Cs or mixtures or chemical combinations thereof, preferably Li,
AE=Sr, Ca, Ba, or mixtures or chemical combinations thereof, preferably Ba and/or Sr,
x>0 and <1 and y≥0 and <1, wherein 1-x-y>0 and a, b≥0 and <0.2 and z≥0 and ≤1,
or mixtures or chemical combinations thereof.

Preferably it essentially consists thereof.

According to a preferred embodiment of the present invention, the second material comprises a material selected from the group consisting of:
$(Ca,Sr)Ga_2O_6$:Eu, $(Ca,Sr,Ba)La_2Bi_2(SiO_4)_3O$:Eu, $(Ca,Sr,Ba)SnCO_3$:Eu, $(Ca,Y,Gd)MoO_4$:Eu, $(Y,Gd)BCO_3$ (pseudo-vaterite):Eu, $(Y,Tb)SiO_5$:Eu, $A-La_2O_3$:Eu, $Ba_2(SiO_4):O_2$:Eu, $Ba_2MgSi_2O_7$:Eu, $Ba_2Y(BO_3)_2Cl$:Eu, $Ba_3(PO_4)_2$:Eu, $Ba_3Ca_2(PO_4)_4$:Eu, $Ba_3Gd(BO_3)_3$:Eu, $Ba_3Gd_2(BO_3)_4$:Eu, $Ba_3La_2(BO_3)_4$:Eu, $Ba_3V_2O_8$:Eu, $Ba_3Y_2(BO_3)_4$:Eu, $BaB_8O1_3$:Eu, $Ba_3BPO_5$:Eu, $BaFCl$:Eu, $BaGd_2O_4$:Eu, $BaGd_4Si_5O1_7$:Sm:Eu, $BaGdBgO1_6$:Eu, $BaLaB_9O1_6$:Eu, $BaSO_4$:Eu, $BaY_2F_8$:Yb:Eu, $BaY_2Si_3O10$:Eu, $BaYB_9O1_6$:Eu, $BaZr(BO_3)_2$:Eu, $BaZrO_3$:Eu, $BaZrO_3$:Eu, $b-BaB_2O_4$:Eu, $B-Gd_2O_3$:Eu, $Ca_2Al(AlSiO_7)$:Eu, $Ca_2Gd_2(GeO_4)_2O$:Eu, $Ca_2Gd_8(SiO_4)_6O_2$:Eu, $Ca_2Gd_8Si_6O_{26}$:Eu, $Ca_2La_8(SiO_4)_6O_2$:Eu, $Ca_3(BO_3)_2$:Eu, $Ca_3Al_2O_6$:Eu, $Ca_3Gd_2(BO_3)_4$:Eu, $Ca_3La_2(BO_3)_4$:Eu, $Ca_3Y_2(BO_3)_4$:Eu, $Ca_4GdO(BO_3)_3$:Eu, $Ca_5(PO11)_3F$:Eu, $Ca_5(PO_4)_3Br$:Eu, $Ca_5(PO_4)_3F:(_4f$-site):Eu, $Ca_5(PO_4)_3F:(_6h$-site):Eu, $Ca_5(PO_4)_3OH$:Eu, $CaBPO_5$:Eu, $CaF_2$:Eu, $CaLaB_7O1_3$:Eu, calcite-$CaCO_3$:Eu, $CaO$:Eu, $CaSO_4$:Eu, $CaYO(BOs)$:Eu, $C-Gd_2O_3$:Eu, $C-LU_2O_3:(C_2)$:Eu, $C-Lu_2O_3:(C_3i)$:Eu, $Cs_2NaYF_6$:Tm:Eu, $C-Sc_2O_3$:Yb:Eu, $C-Y_2O_3$:Eu, $Eu[(ttfa)_3(phen)]0$:Eu, $Gd1_{7.33}(BO_3)_4(B_2O_5)_2O_{16}$:Eu, $GdBO3$:Eu, $Gd_2BaZnO_5$:Eu, $Gd_2O_2(SO_4)$:Eu, $Gd2O2S$:Eu, $Gd_2P_4O1_3$:Eu, $Gd_3O_4Br$:Eu, $Gd_3PO_7$:Eu, $Gd_3Te_2Li_3O1_2$:Eu, $Gd_8P_2O1_7$:Eu, $GdAl_3(BO_3)_4$:Eu, $GdAlO_3$:Eu, $GdAlO_3$:Eu, $GdB_3O_6$:Eu, $GdBO_3$:Eu, $GdGaO_3$:Eu, $GdOBr$:Eu, $GdOCl$:Eu, $GdP_3O_9$:Eu, $GdPO_4$:Eu, $I-CaB_2O_4$:Eu, $InBO_3$:Eu, $I-SrB_2O_4$:Eu, $KCaGd(PO_4)_2$:Eu, $La_{26}O_{27}(BO_3)_8$:Eu, $La_2BaZnO_5$:Eu, $La_2Hf_2O_7$:Eu, $La_2O_2(SO_4)$:Eu, $La_2O_2S$:Eu, $La_2O_2S$:Eu, $La_2W_3O_{12}$:Eu, $La_2Zr_3(MoO_4)_9$:Eu, $La_3TaO_4Cl_6$:Eu, $La_3TaO_4Cl_6$:Eu, $La_3WO_6Cl_3$:Eu, $La_3WO_6Cl_3$:Eu, $LaAlO_3$:Eu, $LaAlO_3$:Eu, $LaB_3O_6$:Eu, $LaBO_3$:Eu, $LaF_3$:Eu, $LaF_3$:Eu, $LaGaO_3$:Eu, $LaMgB_5O10$:Eu, $LaOBr$:Eu, $LaOCl$:Eu, $LaOF$:Eu, $LaOI$:Eu, $LaP_3O_9$:Eu, $LaPO_4$:Eu, $LaYO_3$:Eu, $Li_2Lu_5O_4(BO_3)_3$:Eu, $Li_3Ba_2La_3(MoO_4)_8$:Eu, $Li_3La_2(BO_3)_3$:Eu, $Li_6Gd(BO_3)_3$:Eu, $Li_6Y(BO_3)_3$:Eu, $Li-CaAlF_6$:Eu, $LiEuMo_2O_8$:Eu, $LiGd_6O_5(BO_3)_3$:Eu, $LiGdF_4$:Eu, $LiGdGeO_4$:Eu, $LiGdO_2$:Eu, $LiGdSiO_4$:Eu, $LiLa_2O_2BO_3$:Eu, $LiLaGeO_4$:Eu, $LiLaO_2$:Eu, $Li-LaP_4O1_2$:Eu, $LiLaSiO_4$:Eu, $LiLuGeO_4$:Eu, $LiLuO_2$:Eu, $LiLuSiO_4$:Eu, $LiScO_2$:Eu, $LiSr_2YO_4$:Eu, $LiSrAlF_6$:Eu, $LiSrAlF_6$:Eu, $LiY_6O_5(BO_3)_3$:Eu, $LiYF_4$:Eu, $LiYGeO_4$:Eu, $LiYO_2$:Eu, $LiYSiO_4$:Eu, $Lu_2O_2(SO_4)$:Eu, $Lu_2Si_2O_7$:Eu, $Lu_3Al_5O_{12}$:Eu, $Lu_3Al_5O_{12}$:Yb:Eu, $LuBO_3$:Eu, $LuBO_3$ (calcite):Eu, $LuOCl$:Eu, $LuPO_4$:Eu, $Mg_2Gd_8(SiO_4)_6O_2$:Eu, $Mg_2La_8(SiO_4)_6O_2$:Eu, $MgO$:Eu, $MgSiO_3$:Eu, $Na_3YSi_3O_9$:Eu, $Na_6Gd(BO_3)_3$:Eu, $NaGdGeO_4$:Eu, $NaGdO_2$:Eu, $NaGdSiO_4$:Eu, $NaGdSiO_4$:Eu, $Na-LaGeO_4$:Eu, $NaLaO_2$:Eu, $NaLaSiO_4$:Eu, $NaLuGeO_4$:Eu, $NaLuSiO_4$:Eu, $NaScO_2$:Eu, $NaSrLa(VO_4)_2$:Eu, $NaYGeO_4$:Eu, $NaYSiO_4$:Eu, $ScBO_3$:Eu, $ScOCl$:Eu, $ScPO_4$:Eu, $Sr_2B_2O_5$:Eu, $Sr_2Gd_8(SiO_4)_6O_2$:Eu, $Sr_2La_2Zn_2O_7$:Eu, $Sr_2La_2Zn_2O_7$:Eu, $Sr_2LaAlO_5$:Eu, $Sr_3(BO_3)_2$:Eu, $Sr_3(PO_4)_2$:Eu, $Sr_3(PO_4)_2$:Sm:Eu, $Sr_3Gd_2(BO_3)_4$:Eu, $Sr_3La_2(BO_3)_4$:Eu, $Sr_3La_6(SiO_4)_6$:Eu, $Sr_3Y_2(BO_3)_4$:Eu, $Sr_5(PO_4)_3F$:Eu, $Sr_9Ln(VO_4)_7$:Eu, $SrAl_2B_2O_7$:Eu, $SrB_4O_7$:Eu, $SrB_6O10$:Eu, $SrCO_3$:Eu, $SrGdAlO_4$:Eu, $SrHfO_3$:Tm:Eu, $SrLa_2BeO_5:(_4c)$:Eu, $SrLa_2BeO_5:(_8d)$:Eu, $SrLaAlO_4$:Eu, $SrLaGa_3O_7$:Eu, $SrLaO(BO_3)$:Eu, $SrO$:Eu, $SrY_2O_4$:(Sr-site):Eu, $SrY_2O_4$:(Y-site1):Eu, $SrY_2O_4$:(Y-site_2):Eu, $Tb_2Mo_3O1_2$:Eu, $Tb_2W_3O1_2$:Eu, $TbBO_3$:Eu, $ThO_2$:Eu, $X1-Gd_2SiO_5$:Eu, $X1-Y_2SiO_5$:Eu, $X_2-Y_2SiO_5$:Eu, $Y1_{7.33}(BO_3)_4(B_2O_5)_2O_{16}$:Eu, $YBO_3$:Eu, $Y_2Ge_2O_7$:Eu, $Y_2GeO_5$:Eu, $Y_2O_2(SO_4)$:Eu, $Y_2O_2S$:Eu, $Y_2O_2S$:Eu, $Y_2O_3$:Eu, $Y_2P_4O_{13}$:Eu, $Y_2Si_2O_7$:Eu, $Y_2SiO_5$:Eu, $Y_3Al_5O_{12}$:Eu, $Y_3Ga_5O_{12}$:Eu, $Y_3O_4Br$:Eu, $Y_3O_4Cl$:Eu, $Y_3PO_7$:Eu, $Y_4GeO_8$:Eu, $Y_8P_2O_{17}$:Eu, $YAl_3(BO_3)_4$:Eu, $YAlO_3$:Eu, $YAlO_3$:Eu, $YBO_3$:Eu, $YbOBr$:Yb:Eu, $YF_3$:Eu, $YOBr$:Eu, $YOCl$:Eu, $YOCl$:Eu, $YOF$:Eu, $YOF$:Eu, $YP_3O_9$:Eu, $YPO_4$:Eu, $YTaO_4$:Eu, $YVO_4$:Eu, $ZrP_2O_7$:Eu, or mixtures or chemical combinations thereof.

Preferably it essentially consists thereof.

According to a preferred embodiment, the first and the second material are provided as a mixture. This can be achieved in several ways:

Firstly, the first and second materials may be present as a simple powder mixture. According to an alternative and also preferred embodiment, the first and the second material are embedded in a further material serving as a quasi "matrix material" such as silicone/polymeric materials or glass, etc.

The device according to the invention may be used in a variety of specific topological structures or applications, including—but not limited to—the following:

1. "Chip Coating": An LED semiconductor chip is coated with the phosphor powder, subsequently chip and phosphor are coated with a transparent medium (polymer or glass).

2. "Phosphor powder in a polymer or glass matrix": The phosphor powder is mixed with glass or a transparent polymer as homogeneously as possible and applied to the chip.

3. Combination of "Chip Coating" and "phosphor powder in a polymer or glass matrix".

4. "Remote phosphor in transmission mode": The phosphor powder is mixed with glass or a transparent polymer as homogeneously as possible and placed on a reflection chamber in which the semiconductor chip is disposed. The light can only escape through the phosphor powder (transmission).

5. "Remote phosphor in reflection mode": The phosphor powder is applied onto a reflective carrier (or is coated with a reflective material on the back side). The LED light source is disposed in or slightly sideward from the emission direction and irradiates onto the phosphor powder. The converted light is re-emitted in the direction of the light source or in the radiation direction, the light which has passed through the phosphor powder (transmission) is re-directed by means of the back side reflective layer in the emission direction. The light can therefore only escape in the reflection direction.

According to a further embodiment of the invention the first and the second material are provided as a ceramic, wherein the second material is distributed or dispersed in the first material.

This approach has the advantage that it further increases the absorption probability of the materials in most applications, often also compared with powder mixtures.

The term "ceramic" according to the present invention refers to and/or encompasses in particular a compact crystalline or polycrystalline material which includes a controlled amount of pores or is non-porous.

The term "polycrystalline material" according to the present invention refers to and/or encompasses in particular a material having a bulk density of greater than 90 percent of the main component, consisting of more than 80 percent of individual crystal domains, wherein each crystal domain has a diameter of 0.1-10 µm and a different crystallographic orientation. The individual crystal domains may be bonded to each other or diluted via an amorphous or glassy material or by additional crystalline phases.

According to a preferred embodiment of the present invention the crystalline material has a density of ≥90% to ≤100% of the theoretical density. This has been found to be advantageous for many applications of the present invention.

The term "dispersed" according to the present invention refers to and/or encompasses in particular, that the first material is distributed in the second material in the form of spherical particles or particles of reduced symmetry. In a narrower sense this means that the first material is distributed so homogeneous that the composite ceramic exhibits photoluminescence with a homogeneous color point in the far field. The second material thus serves as a kind of "matrix material" for the first material.

The term "matrix material" according to the present invention refers to or encompasses in particular a material which is used as an embedding material or acts supportive to fix the embedded material/the embedded materials at their defined locations and/or an inorganic, ceramic/polycrystalline and light emitting material, in which one or more inorganic light emitting materials are embedded. The matrix material may—and this represents a preferred embodiment of the invention—be compressed by a thermal process such that a firm inclusion of the embedded light emitting materials is achieved.

Preferably, the second material has a particle size distribution D90 of ≤20 µm. This has been found to be advantageous for many applications. This particle size distribution can for example be measured by means of a Mastersizer or by dynamic light scattering of laser light.

Preferably, the first material has a particle size distribution D50 of ≤10 µm. Again, this has often proved to be advantageous.

It should be noted that the converter system according to a preferred embodiment of the invention may also consist of more than two luminescent materials.

In particular, according to a preferred embodiment of the invention, the converter system includes at least one further red emitting material. This has been shown to be advantageous for some applications within the present invention.

Preferred additional red emitting materials include oxide and nitride-based compounds with activators including, for example, $Eu^{2+}$ or $Mn^{4+}$, that emit light beyond 615 nm, and mixtures thereof. Examples of additional red emitting materials thus include $(Ca,Sr)SiN_3:Eu^{2+}$, $K_2SiF_6:Mn^{4+}$, $K_2TiF_6:Mn^{4+}$, $Sr[LiAl_3N_4]:Eu^{2+}$, red-emitting quantum dot (QD) or a second, red-emitting LED, and related materials. Including these additional materials within the present invention can allow for the increase in CRI beyond 90 and R9>50 while still maintaining a very high LER, which is achieved by the well-chosen $Eu^{3+}$ emission of the first red-emitting material.

The converter system according to the invention can be used in a variety of specific topological structures or applications, including—but not limited thereto—the following:

1. "Direct deposited phosphor ceramic":

The phosphor ceramic is applied directly as a thin plate onto an LED dice.

2. "Remote phosphor" systems:

"Remote phosphor" systems in particular mean devices in which a phosphor (luminophore, engl.: phosphor) is arranged remote from a light emitting light source emitting in a narrow wavelength range, usually embedded in or linked to a polymer, glass or ceramic matrix. Thus, a remote phosphor system is fundamentally different from a system in which the phosphor is applied directly onto or at the light source such as in LED light sources in which the phosphor is applied directly onto the light emitting dice. Usually, a distinction is made between two basic structures, from which many variants can be derived:

a) "Remote phosphor in transmission mode": The phosphor matrix is placed onto a reflection chamber in which the LED is disposed. The light can escape only through the phosphor matrix (transmission).

b) "Remote phosphor in reflection mode": The phosphor matrix is applied onto a reflective carrier or is coated with a reflective material on the back side, the LED light source is disposed in or slightly sideward from the emission direction and irradiates onto the phosphor matrix. The converted light is re-emitted in the direction of the light source or in the radiation direction, the light which has passed through the phosphor matrix is re-directed through the phosphor matrix in the emission direction by means of the back side reflective layer. Thus, the light can only escape in the reflection direction.

The present invention also relates to a light emitting device comprising a converter system according to the present invention and a blue light emitting material.

Preferably this blue light emitting materials emits light towards the converter system with a wavelength of <470 nm, preferably ≥430 to ≤465 nm. It has surprisingly been found that this has been advantageous for many applications within the present invention although the second material with in the present invention has an excitation maximum at 465 nm.

Preferably the light emitting device emits white light, which is in the context of this invention especially defined as light achieving a chromaticity within +/−20 points of the blackbody loci in the u' v' chromaticity space.

Preferably the white light is characterized by a lumen equivalent of radiation greater than 330 lm/W.

Preferably the white light is characterized by a color rendering index greater than 85.

The present invention also relates to a light emitting system comprising a light emitting device according to the present invention. Preferably the lighting system is a lamp or luminaire.

The devices to be used according to the invention mentioned above and claimed and described in the exemplary embodiments are not subject to any particular exceptions with respect to their size, shape, material selection and technical conception, so that the selection criteria well-known in the field of application can be applied without restriction.

Further details, features and advantages of the object of the present invention can be obtained from the claims and from the following description of the accompanying drawings, in which—by way of example—several embodiments of the device according to the invention are shown, as well as with respect to the examples, which are to be considered as purely illustrative and not limiting. In the drawings:

Figure 3:
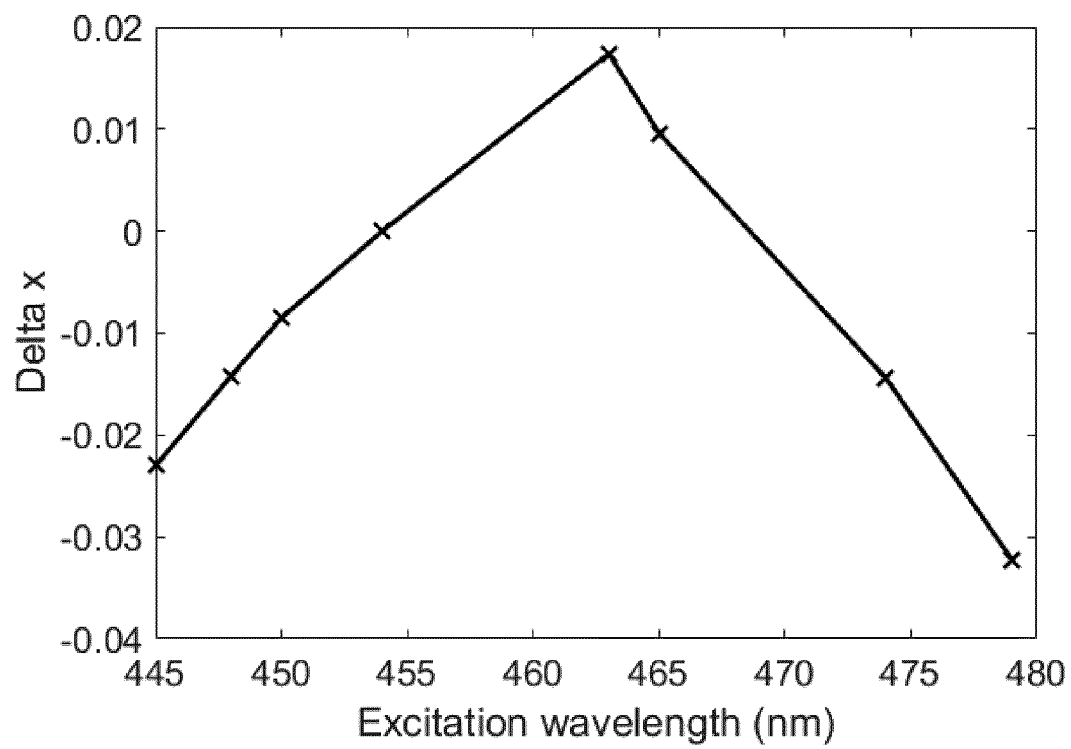
Figure 4:
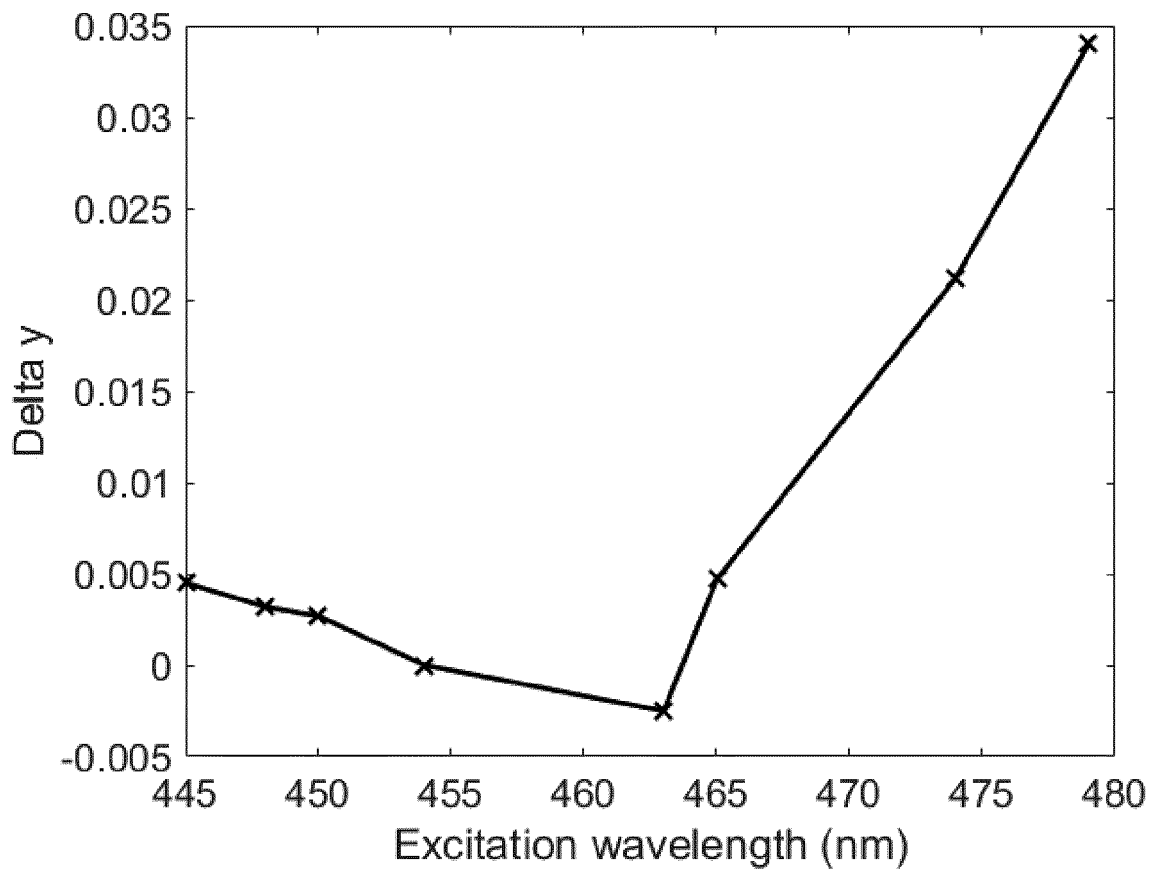
Figure 5:
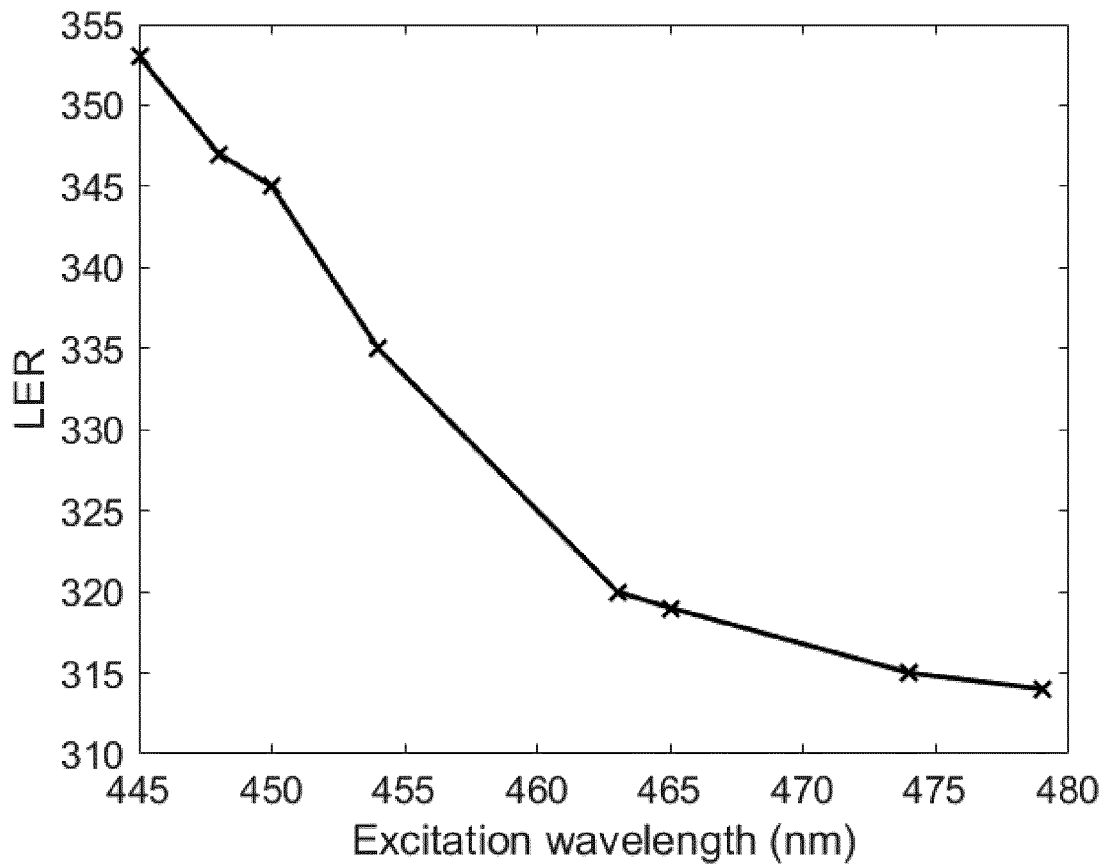
Figure 6:
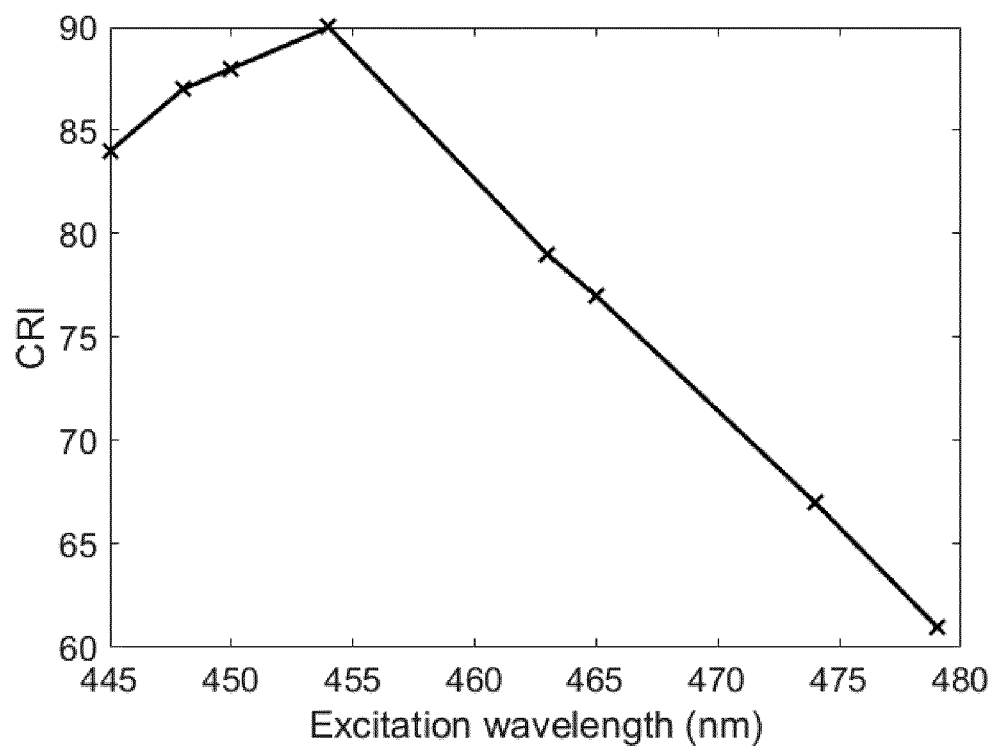
Figure 7:
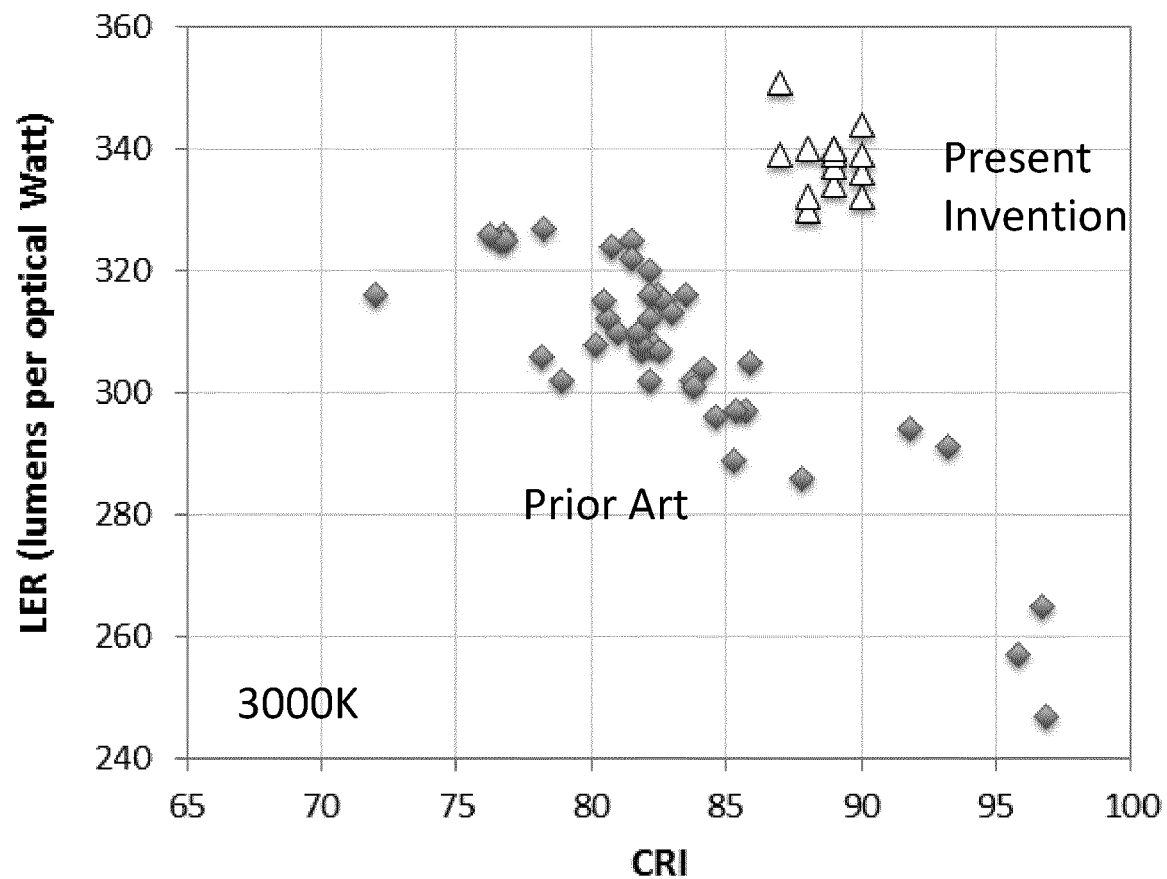

FIG. 3 shows a diagram illustrating the change of x-chromaticity against the LED excitation wavelength for the converter system of Example II FIG. 4 shows a diagram illustrating the change of y-chromaticity against the LED excitation wavelength for the converter system of Example II FIG. 5 shows a diagram illustrating the change of LER against the excitation wavelength for the converter system of Example II;

FIG. 6 shows a diagram illustrating the change of CRI against the excitation wavelength for the converter system of Example II FIG. 7 shows a diagram of LER vs color rendering properties for white LED emission spectra based on converter systems of the prior art vs. several of those for the present invention.

Figure 8:
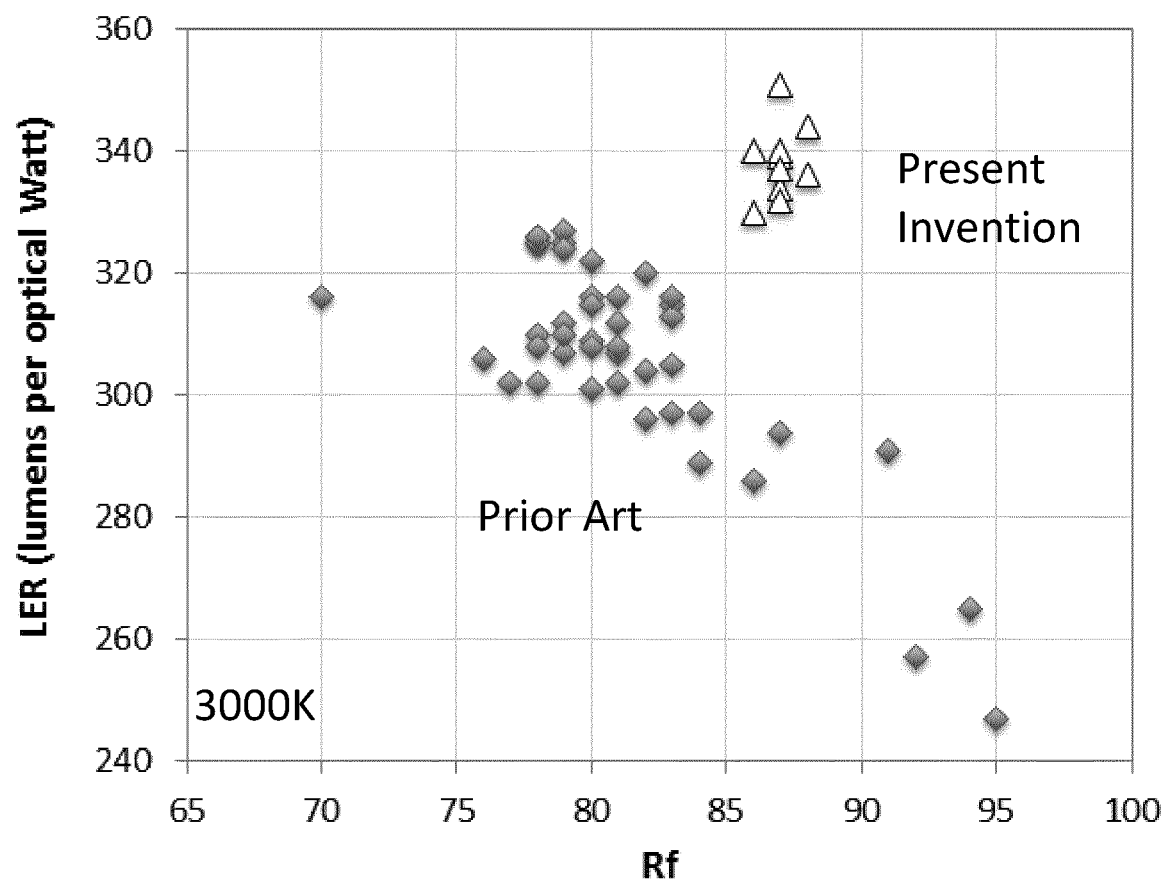

FIG. 8 show a diagram of LER vs color rendering properties for white LED emission spectra based on converter systems of the prior art vs. several of those for the present invention.

Hereinafter the invention is explained by way of examples, which are to be considered purely as illustrative and not as limiting.

EXAMPLE I

Example I refers to a light emitting device targeting a white light emission and comprising a ceramic made of 90 vol.-% $Li_3Ba_2Eu_{2.4}Tb_{0.6}(MoO_4)_8$ and 10 Vol.-% $Lu_3Al_5O_{12}:Ce(0.065\%)$. This was prepared as follows:

Synthesis of $Li_3Ba_2Eu_{2.4}Tb_{0.6}(MoO_4)_8$ 0.7894 g (4.000 mmol) $BaCO_3$, 2.3030 g (16.000 mmol) $MoO_3$, 0.2217 g (3.000 mmol) $Li_2CO_3$, 0.8446 g (2.400 mmol) $Eu_2O_3$ and 0.2243 g (0.300 mmol) $Tb_4O_7$ were pounded in a mortar with acetone as grinding aid. The obtained powder was dried, transferred to a porcelain crucible and calcinated in air at 800° C. for 12 h. The cake thus obtained was ground and sieved through a 36 μm sieve.

Synthesis of $Lu_{2.9805}Ce_{0.00195}Al_5O_{12}$ 2.9825 g (7.495 mmol) $LU_2O_3$, 0.00168 g (0.0098 mmol) $CeO_2$ and 1.2745 g (12.500 mmol) $Al_2O_3$ were thoroughly pounded in a mortar with acetone as grinding aid. The obtained powder was dried, transferred to a porcelain crucible and heated at 1750° C. for 12 h under a CO atmosphere.

Manufacture of the Ceramic

A mixture of 90 vol.-% $Li_3Ba_2Eu_{2.4}Tb_{0.6}(MoO_4)_8$ and 10 Vol.-% $Lu_3Al_5O_{12}:Ce(0.065\%)$ was thoroughly ground in a mill. The crude phosphor powder thus obtained was mixed with a polyvinylpyrrolidone binder, pressed into pellets and compacted by axial pressing at approximately 225 MPa. The thus obtained ceramic green bodies were placed on a corundum firing shelve and heated at 850° C. in air. After cooling to room temperature, the ceramics were sawed into wafers. The quantum yield is 67% and the color point is located at x=0.510 and y=0.458.

Figure 1:
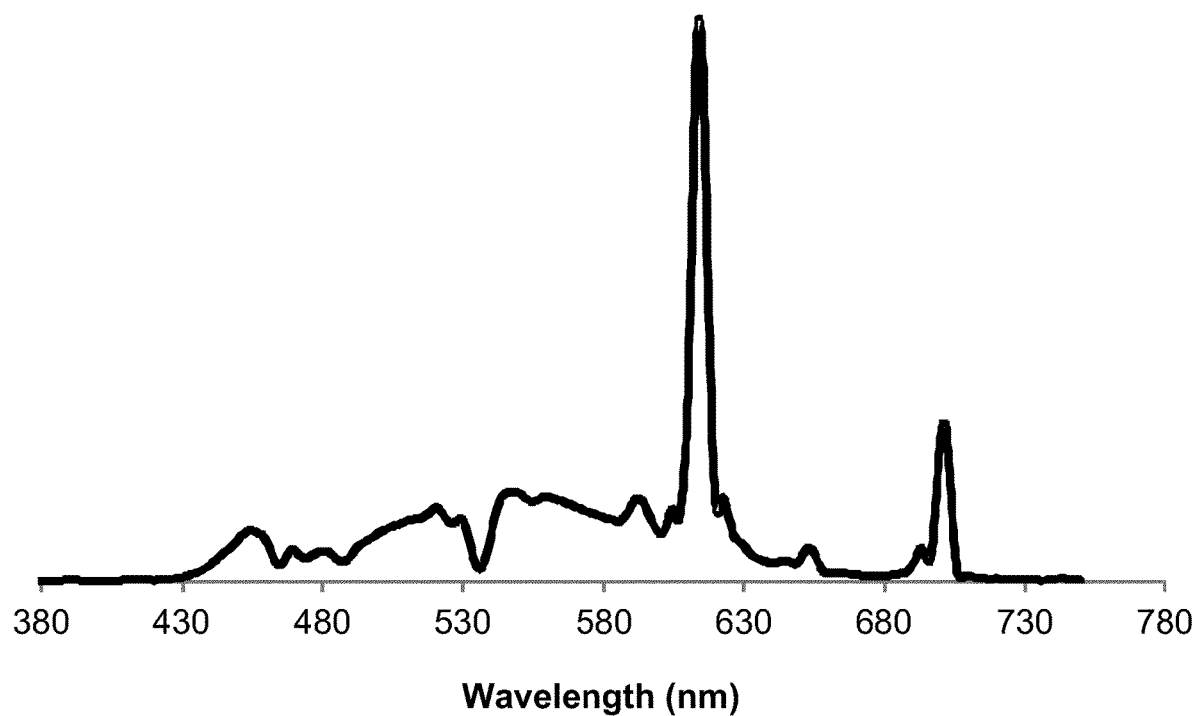
FIG. 1 shows an emission spectrum of a converter system of Example I

FIG. 1 shows the emission spectrum of a converter system based on Example I upon excitation with a 450 nm LED. As can be seen from FIG. 1, the spectrum shows a dip at 535 nm and a peak at 615 nm. This results in a CCT of 2891, a CRI of 90, a R9 of 1 and a LER of 351.

As will be shown also in FIG. 7 later on, this results in a light emitting device with a much better LER for a given CRI than with the prior art.

EXAMPLE II

Example I refers to a converter system comprising $Lu_3Al_5O_{12}:Ce^{3+}$ and $Li_3Ba_2La_2(MoO_4)_8:Eu^{3+}$ which was made mutatis mutandis as in Example II.

Figure 2:
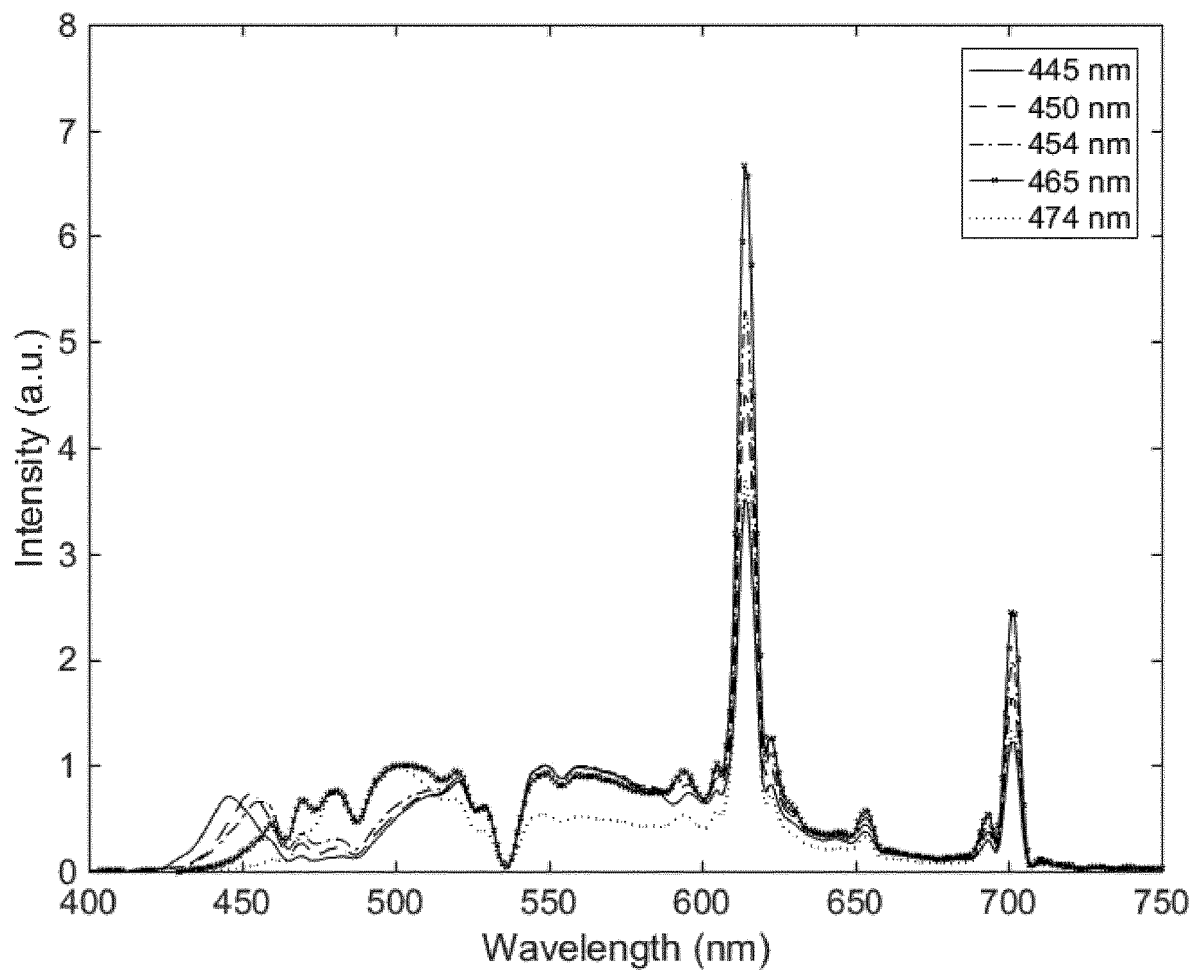
FIG. 2 shows several emission spectra of a converter system of Example II

FIG. 2 shows several emission spectra of a converter system of Example II

FIGS. 3 to 6 show the change in x-chromaticity, y-chromaticity, LER and CRI, respectively, for the converter system of Example II against the excitation wavelength. Surprisingly it was found that the ideal excitation wavelength is <465, for this particular example around 445 to 460 nm.

A surprising result for these examples which target white light emission is that the preferred wavelength of excitation is not at 465 nm, which is the maximum in excitation for $Eu^{3+}$ phosphor materials. Instead, the inventors' experimental data show that it is preferable to excite the system at shorter wavelengths than 465 nm in order to optimize spectral properties.

More detailed results are given in Table 1 below, which shows the characteristics of several converter systems in relation to the excitation wavelength:

TABLE 1

|  | 445 nm | 448 nm | 450 nm | 454 nm | 463 nm | 465 nm | 474 nm | 479 nm |
| --- | --- | --- | --- | --- | --- | --- | --- | --- |
| CCT (K) | 3338 | 3167 | 3065 | 2904 | 2628 | 2794 | 3306 | 3718 |
| x | 0.4217 | 0.4305 | 0.4362 | 0.4447 | 0.4621 | 0.4543 | 0.4303 | 0.4125 |
| Y | 0.4125 | 0.4112 | 0.4107 | 0.4080 | 0.4055 | 0.4127 | 0.4292 | 0.4420 |
| u' | 0.2374 | 0.2435 | 0.2472 | 0.2539 | 0.2663 | 0.2580 | 0.2361 | 0.2206 |
| v' | 0.5224 | 0.5230 | 0.5239 | 0.5241 | 0.5257 | 0.5273 | 0.5299 | 0.5319 |
| X | 0.00075405 | 0.001175 | 0.00086238 | 0.0014532 | 0.00107060 | 0.00155780 | 0.00158680 | 0.00088151 |
| Y | 0.00073758 | 0.00112220 | 0.00081207 | 0.0013334 | 0.00093948 | 0.00141490 | 0.00158280 | 0.00094458 |
| Z | 0.00029644 | 0.00043193 | 0.00030276 | 0.0004813 | 0.00030679 | 0.00045600 | 0.00051813 | 0.00031087 |
| CRI | 84 | 87 | 88 | 90 | 79 | 77 | 67 | 61 |
| R9 | −6 | 1 | 3 | 10 | 21 | 30 | 60 | 74 |
| LER (lm/W) | 353 | 347 | 345 | 335 | 320 | 319 | 315 | 314 |

TABLE 1-continued

|    | 445 nm | 448 nm | 450 nm | 454 nm | 463 nm | 465 nm | 474 nm | 479 nm |
|----|--------|--------|--------|--------|--------|--------|--------|--------|
| Rf | 83     | 86     | 87     | 87     | 74     | 68     | 50     | 41     |
| Rg | 97     | 97     | 97     | 96     | 89     | 84     | 69     | 61     |

FIG. 7 shows a diagram of LER vs CRI for several converter systems of the prior art (taken from databases) and several converter systems of the present invention. It can be seen that the converter systems of the present invention allow for much higher LER for a given CRI than with the prior art.

The data for FIG. 7 is shown in Table 2 below:

TABLE 2

| CRI | 90 | 90 | 90 | 88 | 89 | 89 | 89 | 88 | 88 | 90 |
|---|---|---|---|---|---|---|---|---|---|---|
| CCT (K) | 3028 | 2891 | 2928 | 3111 | 3000 | 2931 | 2932 | 3031 | 2993 | 3000 |
| x | 0.4361 | 0.4481 | 0.4398 | 0.4276 | 0.4389 | 0.4400 | 0.4424 | 0.4343 | 0.4354 | 0.4370 |
| Y | 0.4060 | 0.4130 | 0.4014 | 0.3979 | 0.4082 | 0.4019 | 0.4068 | 0.4026 | 0.4002 | 0.4043 |
| u' | 0.2492 | 0.2539 | 0.2536 | 0.2472 | 0.2501 | 0.2535 | 0.2529 | 0.2495 | 0.2512 | 0.2505 |
| v' | 0.5220 | 0.5265 | 0.5208 | 0.5175 | 0.5233 | 0.5210 | 0.5234 | 0.5206 | 0.5196 | 0.5215 |
| X | 0.00097040 | 0.0048050 | 0.00992900 | 0.00589890 | 0.00103000 | 0.00089858 | 0.00094669 | 0.00029190 | 0.00642040 | 0.00106460 |
| Y | 0.00090335 | 0.0044250 | 0.00906060 | 0.00548860 | 0.00095791 | 0.00082082 | 0.00087067 | 0.00027058 | 0.00590150 | 0.00098502 |
| Z | 0.00035126 | 0.0014820 | 0.00358460 | 0.00240710 | 0.00035899 | 0.00032301 | 0.00032273 | 0.00010957 | 0.00242530 | 0.00038667 |
| R9 | 9 | 1 | 5 | 14 | 8 | 10 | 8 | 2 | 7 | 10 |
| LER (lm/W) | 339 | 351 | 344 | 330 | 340 | 334 | 337 | 340 | 332 | 336 |
| Rf | 87 | 87 | 88 | 86 | 87 | 87 | 87 | 86 | 87 | 88 |
| Rg | 96 | 95 | 98 | 95 | 96 | 97 | 96 | 98 | 96 | 97 |

In addition to the standard measure color rendering index (CRI), color properties based on the Illuminating Engineering Society of North America (IESNA) Technical Memorandum (TM) No. 30 are included in the experimental data of Tables 1 and 2, and designated by the fidelity metric Rf and gamut metric Rg. FIG. 8 shows a diagram of LER vs Rf for the experimental data in Table 2. It can be seen that the converter systems of the present invention allow for much higher LER for a given Rf than with the prior art.

The individual combinations of the ingredients and the characteristics of the embodiments mentioned above are exemplary, the exchange and substitution of the teachings included in this publication with other teachings included in the cited documents are also explicitly contemplated. A person skilled in the art will recognize that variations and modifications of the embodiments described herein and other embodiments may be realized without departing from the spirit and scope of the invention. Accordingly, the above description is to be considered exemplary and not as limiting. The word "comprises" used in the claims does not exclude other elements or steps. The indefinite article "a" does not exclude the importance of a plural. The mere fact that certain measures are recited in mutually different claims does not indicate that a combination of these measures cannot be used to advantage. The scope of the invention is defined in the following claims and the associated equivalents.

The invention claimed is:

1. A converter system for a light emitting device, comprising:
   a first material doped with $Ce^{3+}$; and
   a second material doped with $Eu^{3+}$ and emitting in the red spectral range so that the converter system shows an emission spectrum with a peak between $\geq 605$ to $\leq 630$ nm,
   wherein the ratio of the $Eu^{3+}$ peak to the maximum peak in the green and/or yellow spectral range is $\geq 2$.

2. The converter system of claim 1, wherein the first material is capable of emitting in the green and/or yellow spectral range.

3. The converter system of claim 1, wherein the converter system shows an emission spectrum with a peak between $\geq 610$ to $\leq 630$ nm.

4. The converter system of claim 1, wherein the converter system shows an emission spectrum with a dip between $\geq 520$ to $\leq 545$ nm.

5. The converter system of claim 1 wherein the converter system shows an emission spectrum with a dip between $\geq 530$ to $\leq 540$ nm.

6. The converter system according to claim 1, wherein the first material comprises a garnet and/or cubic material.

7. The converter system according to claim 1, wherein the second material comprises a material selected from the group consisting of phosphates, sulfates, oxides, borates, molybdates, tungstates, vanadates, niobates, tantalates and mixtures or chemical combinations thereof.

8. The converter system according to claim 1, wherein the second, $Eu^{3+}$ doped red emitting material comprises a material of the group comprising $(Ba_{1-x}Sr_x)_{2+n}SiO_{4+n}$:Eu, $(Sr_{1-x}Ca_x)_{2+n}SiO_{4+n}$:Eu,
$(Sr_{1-x}Ca_x)Ga_2S_4$:Eu with x≥0% to ≤1 and n=0 or 1
$(Sr_{1-x}Ca_x)Ga_2S_4$:Eu with x≥0% to ≤1
$ALn_{1-x-y}Eu_xM_2O_8$:$RE_y$,
$(Ln_{1-x-y}Eu_x)_2MO_6$:$RE_{2y}$,
$(Ln_{1-x-y}Eu_x)_2M_2O_9$:$RE_{2y}$,
$(Ln_{1-x-y}Eu_x)_2M_3O_{12}$:$RE_{2y}$,
$(Ln_{1-x-y}Eu_x)_2M_4O_9$:$RE_{2y}$,
$(Ln_{1-x-y}Eu_x)_6MO_{12}$:$RE_{6y}$,
$(AE_{1-2x-y}Eu_xA_{x+y})_3MO_6$:$RE_{3y}$,
$A_3AE_2(Ln_{1-x-y}Eu_x)_3(MO_4)_8$:$RE_y$, wherein—for each structure independently—A is an alkaline metal, i.e. selected from the group consisting of lithium, sodium, potassium, rubidium, cesium and mixtures or chemical combinations thereof, AE is an alkaline earth metal, i.e. selected from the group consisting of beryllium, magnesium, calcium, strontium, barium and mixtures or chemical combinations thereof, Ln is a rare earth metal selected from the group consisting of scandium, yttrium, lanthanum, gadolinium, lutetium and mixtures or chemical combinations thereof, M is molybdenum, tungsten or mixtures or chemical combinations thereof, RE is a rare earth metal selected from the group consisting of terbium, dysprosium, praseodymium, neodymium and mixtures or chemical combinations thereof, wherein 0<x≤1 and 0≤y is ≤0.05;

and/or $Li_3Ba_2(Tb_{1-x-y}Eu_xLn_y)_3(Mo_{1-z}W_z)_8O_{32}$,
$A_3AE_2(Tb_{1-x-y}Eu_xLn_y)_3(Mo_{1-z}W_z)_8O_{32}$,
$A(Tb_{1-x-y}Eu_xLn_y)_2(Mo_{1-z}W_z)O_6$,
$(Tb_{1-x-y}Eu_xLn_y)_2(Mo_{1-z}W_z)O_6$,
$(Tb_{1-x-y}Eu_xLn_y)_2(Mo_{1-z}W_z)_2O_9$,
$(Tb_{1-x-y}Eu_xLn_y)_2(Mo_{1-z}W_z)_4O_{15}$,
$(Tb_{1-x-y}Eu_xLn_y)_2SiO_5$,
$(Tb_{1-x-y}Eu_xLn_y)_2Si_2O_7$,
$A(Tb_{1-x-y}Eu_xLn_y)SiO_4$,
$Ba_2(Tb_{1-x-y}Eu_xLn_y)_2Si_4O_{13}$,
$AE_2(Tb_{1-x-y}Eu_xLn_y)_2Si_4O_{13}$,
$Sr_3(Tb_{1-x-y}Eu_xLn_y)_2Si_6O_{18}$,
$AE_3(Tb_{1-x-y}Eu_xLn_y)_2Si_6O_{18}$,
$(Tb_{1-x-y}Eu_xLn_y)_2GeO_5$,
$(Tb_{1-x-y}Eu_xLn_y)_2Ge_2O_7$,
$A(Tb_{1-x-y}Eu_xLn_y)GeO_4$,
$Ba_2(Tb_{1-x-y}Eu_xLn_y)_2Ge_4O_{13}$,
$AE_2(Tb_{1-x-y}Eu_xLn_y)_2Ge_4O_{13}$,
$Sr_3(Tb_{1-x-y}Eu_xLn_y)_2Ge_6O_{18}$
$AE_3(Tb_{1-x-y}Eu_xLn_y)_2Ge_6O_{18}$
$(Tb_{1-x-y}Eu_xLn_y)_2(Ge_{1-a-b}Zr_aHf_b)O_5$,
$(Tb_{1-x-y}Eu_xLn_y)_2(Ge_{1-a-b}Zr_aHf_b)_2O_7$,
$A(Tb_{1-x-y}Eu_xLn_y)(Ge_{1-a-b}Zr_aHf_b)O_4$,
$Ba_2(Tb_{1-x-y}Eu_xLn_y)_2(Ge_{1-a-b}Zr_aHf_b)_4O_{13}$,
$Sr_3(Tb_{1-x-y}Eu_xLn_y)_2(Ge_{1-a-b}Zr_aHf_b)_6O_{18}$ with (for each material independently)
Ln=La, Gd, Lu, Y or mixtures or chemical combinations thereof,
A=Li, Na, K, Rb, Cs or mixtures or chemical combinations thereof, preferably Li,
AE=Sr, Ca, Ba, or mixtures or chemical combinations thereof, preferably Ba and/or Sr,
x>0 and <1 and y≥0 and <1, wherein 1-x-y>0 and a, b≥0 and <0.2 and z≥0 and ≤1, or mixtures or chemical combinations thereof;
and/or:

$(Ca,Sr)Ga_2O_6$:Eu, $(Ca,Sr,Ba)La_2Bi_2(SiO_4)_3O$:Eu, $(Ca,Sr,Ba)SnO_3$:Eu, $(Ca,Y,Gd)MoO_4$:Eu, $(Y,Gd)BO_3$ (pseudo-vaterite):Eu, $(Y,Tb)SiO_5$:Eu, $A$-$La_2O_3$:Eu, $Ba_2(SiO_4):O_2$—:Eu, $Ba_2MgSi_2O_7$:Eu, $Ba_2Y(BO_3)_2Cl$:Eu, $Ba_3(PO_4)_2$:Eu, $Ba_3Ca_3(PO_4)_4$:Eu, $Ba_3Gd(BO_3)_3$:Eu, $Ba_3Gd_2(BO_3)_4$:Eu, $Ba_3La_2(BO_3)_4$:Eu, $Ba_3V_2O_8$:Eu, $Ba_3Y_2(BO_3)_4$:Eu, $BaB_8O_{13}$:Eu, $BaBPO_5$:Eu, $BaFCl$:Eu, $BaGd_2O_4$:Eu, $BaGd_4Si_5O_{17}$:Sm:Eu, $BaGdB_9O_{16}$:Eu, $BaLaB_9O_{16}$:Eu, $BaSO_4$:Eu, $BaY_2F_8$:Yb:Eu, $BaY_2Si_3O10$:Eu, $BaYB_9O_{16}$:Eu, $BaZr(BO_3)_2$:Eu, $BaZrO_3$:Eu, $BaZrO_3$:Eu, b-$BaB_2O_4$:Eu, B—$Gd_2O_3$:Eu, $Ca_2Al(AlSiO_7)$:Eu, $Ca_2Gd_2(GeO_4)_2O$:Eu, $Ca_2Gd_8(SiO_4)_6O_2$:Eu, $Ca_2Gd_8Si_6O_{26}$:Eu, $Ca_2La_8(SiO_4)_6O_2$:Eu, $Ca_3(BO_3)_2$:Eu, $Ca_3Al_2O_6$:Eu, $Ca_3Gd_2(BO_3)_4$:Eu, $Ca_3La_2(BO_3)_4$:Eu, $Ca_3Y_2(BO_3)_4$:Eu, $Ca_4GdO(BO_3)_3$:Eu, $Ca_5(PO11)_3F$:Eu, $Ca_5(PO_4)_3Br$:Eu, $Ca_5(PO_4)_3F$:($_4$f-site):Eu, $Ca_5(PO_4)_3F$:($_6$h-site):Eu, $Ca_5(PO_4)_3OH$:Eu, $CaBPO_5$:Eu, $CaF_2$:Eu, $CaLaB_7O_{13}$:Eu, calcite-$CaCO_3$:Eu, $CaO$:Eu, $CaSO_4$:Eu, $CaYO(BO_3)$:Eu, C—$Gd_2O_3$:Eu, C-$LU_2O_3$:($C_2$):Eu, C-$LU_2O_3$:($C_3$i):Eu, $Cs_2NaYF_6$:Tm:Eu, C—$Sc_2O_3$:Yb:Eu, C—$Y_2O_3$:Eu, $Eu[(ttfa)_3(phen)]0$:Eu, $Gd1_{7.33}(BO_3)_4(B_2O_5)_2O1_6$:Eu, $GdBO3$:Eu, $Gd_2BaZnO_5$:Eu, $Gd_2O_2(SO_4)$:Eu, Gd2O2S:Eu, $Gd_2P_4O1_3$:Eu, $Gd_3O_4Br$:Eu, $Gd_3PO_7$:Eu, $Gd_3Te_2Li_3O1_2$:Eu, $Gd_8P_2O1_7$:Eu, $GdAl_3(BO_3)_4$:Eu, $GdAlO_3$:Eu, $GdAlO_3$:Eu, $GdB_3O_6$:Eu, $GdBO_3$:Eu, $GdGaO_3$:Eu, $GdOBr$:Eu, $GdOCl$:Eu, $GdP_3O_9$:Eu, $GdPO_4$:Eu, I—$CaB_2O_4$:Eu, $InBO_3$:Eu, I—$SrB_2O_4$:Eu, $KCaGd(PO_4)_2$:Eu, $La_{26}O_{27}(BO_3)_8$:Eu, $La_2BaZnO_5$:Eu, $La_2Hf_2O_7$:Eu, $La_2O_2(SO_4)$:Eu, $La_2O_2S$:Eu, $La_2O_2S$:Eu, $La_2W_3O_{12}$:Eu, $La_2Zr_3(MoO_4)_9$:Eu, $La_3TaO_4Cl_6$:Eu, $La_3TaO_4Cl_6$:Eu, $La_3WO_6Cl_3$:Eu, $La_3WO_6Cl_3$:Eu, $LaAlO_3$:Eu, $LaAlO_3$:Eu, $LaB_3O_6$:Eu, $LaBO_3$:Eu, $LaF_3$:Eu, $LaF_3$:Eu, $LaGaO_3$:Eu, $LaMgB_5O10$:Eu, $LaOBr$:Eu, $LaOCl$:Eu, $LaOF$:Eu, $LaOI$:Eu, $LaP_3O_9$:Eu, $LaPO_4$:Eu, $LaYO_3$:Eu, $Li_2Lu_5O_4(BO_3)_3$:Eu, $Li_3Ba_2La_3(MoO_4)_8$:Eu, $Li_3La_2(BO_3)_3$:Eu, $Li_6Gd(BO_3)_3$:Eu, $Li_6Y(BO_3)_3$:Eu, $LiCaAlF_6$:Eu, $LiEuMo_2O_8$:Eu, $LiGd_6O_5(BO_3)_3$:Eu, $LiGdF_4$:Eu, $LiGdGeO_4$:Eu, $LiGdO_2$:Eu, $LiGdSiO_4$:Eu, $LiLa_2O_2BO_3$:Eu, $LiLaGeO_4$:Eu, $LiLaO_2$:Eu, $LiLaP_4O1_2$:Eu, $LiLaSiO_4$:Eu, $LiLuGeO_4$:Eu, $LiLuO_2$:Eu, $LiLuSiO_4$:Eu, $LiScO_2$:Eu, $LiSr_2YO_4$:Eu, $LiSrAlF_6$:Eu, $LiSrAlF_6$:Eu, $LiY_6O_5(BO_3)_3$:Eu, $LiYF_4$:Eu, $LiYGeO_4$:Eu, $LiYO_2$:Eu, $LiYSiO_4$:Eu, $Lu_2O_2(SO_4)$:Eu, $Lu_2Si_2O_7$:Eu, $Lu_3Al_5O1_2$:Eu, $Lu_3Al_5O1_2$:Yb:Eu, $LuBO_3$:Eu, $LuBO_3$ (calcite):Eu, $LuOCl$:Eu, $LuPO_4$:Eu, $Mg_2Gd_8(SiO_4)_6O_2$:Eu, $Mg_2La_8(SiO_4)_6O_2$:Eu, $MgO$:Eu, $MgSiO_3$:Eu, $Na_3YSi_3O_9$:Eu, $Na_6Gd(BO_3)_3$:Eu, $NaGdGeO_4$:Eu, $NaGdO_2$:Eu, $NaGdSiO_4$:Eu, $NaGdSiO_4$:Eu, $NaLaGeO_4$:Eu, $NaLaO_2$:Eu, $NaLaSiO_4$:Eu, $NaLuGeO_4$:Eu, $NaLuSiO_4$:Eu, $NaScO_2$:Eu, $NaSrLa(VO_4)_2$:Eu, $NaYGeO_4$:Eu, $NaYSiO_4$:Eu, $ScBO_3$:Eu, $ScOCl$:Eu, $ScPO_4$:Eu, $Sr_2B_2O_5$:Eu, $Sr_2Gd_8(SiO_4)_6O_2$:Eu, $Sr_2La_2Zn_2O_7$:Eu, $Sr_2La_2Zn_2O_7$:Eu, $Sr_2LaAlO_5$:Eu, $Sr_3(BO_3)_2$:Eu, $Sr_3(PO_4)_2$:Eu, $Sr_3(PO_4)_2$:Sm:Eu, $Sr_3Gd_2(BO_3)_4$:Eu, $Sr_3La_2(BO_3)_4$:Eu, $Sr_3La_6(SiO_4)_6$:Eu, $Sr_3Y_2(BO_3)_4$:Eu, $Sr_5(PO_4)_3F$:Eu, $Sr_9Ln(VO_4)_7$:Eu, $SrAl_2B_2O_7$:Eu, $SrB_4O_7$:Eu, $SrB_6O10$:Eu, $SrCO_3$:Eu, $SrGdAlO_4$:Eu, $SrHfO_3$:Tm:Eu, $SrLa_2BeO_5$:($_4$c):Eu, $SrLa_2BeO_5$:($_8$d):Eu, $SrLaAlO_4$:Eu, $SrLaGa_3O_7$:Eu, $SrLaO(BO_3)$:Eu, $SrO$:Eu, $SrY_2O_4$:(Sr-site):Eu, $SrY_2O_4$:(Y-site1):Eu, $SrY_2O_4$:(Y-site$_2$):Eu, $Tb_2Mo_3O1_2$:Eu, $Tb_2W_3O1_2$:Eu, $TbBO_3$:Eu, $ThO_2$:Eu, X1-$Gd_2SiO_5$:Eu, X1-$Y_2SiO_5$:Eu, $X_2$—$Y_2SiO_5$:Eu, Yl$_{7.33}$(BO$_3$)$_4$(B$_2$O$_5$)$_2$O$_{16}$:Eu, YBO$_3$:Eu, Y$_2$Ge$_2$O$_7$:Eu, Y$_2$GeO$_5$:Eu, Y$_2$O$_2$(SO$_4$):Eu, Y$_2$O$_2$S:Eu, Y$_2$O$_2$S:Eu, Y$_2$O$_3$:Eu, Y$_2$P$_4$O$_{13}$:Eu, Y$_2$Si$_2$O$_7$:Eu, Y$_2$SiO$_5$:Eu, Y$_3$Al$_5$O$_{12}$:Eu, Y$_3$Ga$_5$O$_{12}$:Eu, Y$_3$O$_4$Br:Eu, Y$_3$O$_4$Cl:Eu, Y$_3$PO$_7$:Eu, Y$_4$GeO$_8$:Eu, Y$_8$P$_2$O$_{17}$:Eu, YAl$_3$(BO$_3$)$_4$:Eu, YAlO$_3$:Eu, YAlO$_3$:Eu, YBO$_3$:Eu, YbOBr:Yb:Eu, YF$_3$:Eu, YOBr:Eu, YOCl:Eu, YOCl:Eu, YOF:Eu, YOF:Eu, YP$_3$O$_9$:Eu, YPO$_4$:Eu, YTaO$_4$:Eu, YVO$_4$:Eu, ZrP$_2$O$_7$:Eu, or mixtures or chemical combinations thereof.

9. A light emitting device comprising a converter system according to claim 1 and a blue light emitting material.

10. The light emitting device according to claim 9, wherein the blue light emitting material emits light towards the converter system with a wavelength of <465 nm.

11. The light emitting device according to claim 9, wherein the light emitting device emits white light.

12. The light emitting device according to claim 11 wherein the white light is characterized by a lumen equivalent of radiation greater than 330 lm/W.

13. The light emitting device according to claim 11, wherein the white light is characterized by a color rendering index greater than 85.

14. A lighting system comprising a light emitting device according to claim 9.

15. The lighting system according to claim 14, wherein the lighting system is a lamp or luminaire.

* * * * *